United States Patent
Chu

(10) Patent No.: US 10,177,277 B2
(45) Date of Patent: Jan. 8, 2019

(54) FLIP CHIP TYPE LIGHT-EMITTING DIODE AND METHOD FOR MANUFACTURING THE SAME

(71) Applicants: DUO POWER LIGHTING TECHNOLOGY, Chiayi County (TW); Tsai-Ku Wu, Kaohsiung (TW)

(72) Inventor: Chang-Hsin Chu, Tainan (TW)

(73) Assignees: DUO POWER LIGHTING TECHNOLOGY, Chiayi County (TW); Tsai-ku Wu, Kaohsiung (TW)

(*) Notice: Subject to any disclaimer, the term of this patent is extended or adjusted under 35 U.S.C. 154(b) by 0 days.

(21) Appl. No.: 15/871,030

(22) Filed: Jan. 14, 2018

(65) Prior Publication Data

US 2018/0212104 A1 Jul. 26, 2018

(30) Foreign Application Priority Data

Jan. 20, 2017 (TW) .............................. 106102142 A

(51) Int. Cl.
| | | |
|---|---|---|
| H01L 33/36 | (2010.01) | |
| H01L 33/08 | (2010.01) | |
| H01L 33/00 | (2010.01) | |
| H01L 33/64 | (2010.01) | |
| H01L 33/62 | (2010.01) | |
| H05K 1/05 | (2006.01) | |

(52) U.S. Cl.
CPC .......... *H01L 33/36* (2013.01); *H01L 33/0095* (2013.01); *H01L 33/08* (2013.01); *H01L 33/62* (2013.01); *H01L 33/644* (2013.01); *H05K 1/053* (2013.01)

(58) Field of Classification Search
CPC ......... H01L 33/08; H01L 33/36; H01L 33/62; H01L 33/644; H05K 1/053
See application file for complete search history.

(56) References Cited

U.S. PATENT DOCUMENTS

| | | | | |
|---|---|---|---|---|
| 7,675,755 B2* | 3/2010 | Imai | .................. | H01L 33/64 361/760 |
| 2005/0002428 A1* | 1/2005 | Kwak | .................. | H01S 5/0206 372/36 |
| 2006/0261364 A1* | 11/2006 | Suehiro | .................. | H01L 33/56 257/100 |

(Continued)

*Primary Examiner* — Allan R Wilson
(74) *Attorney, Agent, or Firm* — CKC & Partners Co., Ltd.

(57) ABSTRACT

In a flip chip type light-emitting diode, a light-emitting diode structure possesses one unique layer with properties of both thermal conduction and electrical isolation disposed on its second contact metal layer. A first dielectric layer covers the light-emitting diode structure. A first-level metal interconnect is divided into three blocks, which are disposed on the first dielectric layer and are respectively connected to a first contact metal layer, the second contact metal layer, and the insulated heat-transfer layer. A first bonding pad structure, a second bonding pad structure, and a heat-dissipating pad structure, forming a second-level interconnect metal layer, are disposed on a second dielectric layer and respectively connected to the blocks of the first-level metal interconnect. The first bonding pad structure, the second bonding pad structure, and the heat-dissipating pad structure are respectively disposed on a first electrode, a second electrode, and a heat-dissipating electrode of a circuit board.

13 Claims, 8 Drawing Sheets

(56) References Cited

U.S. PATENT DOCUMENTS

| | | | |
|---|---|---|---|
| 2008/0101071 A1* | 5/2008 | Imai | H01L 33/64 |
| | | | 362/294 |
| 2012/0112220 A1* | 5/2012 | West | H01L 33/46 |
| | | | 257/98 |
| 2013/0146912 A1* | 6/2013 | Su | H01L 33/641 |
| | | | 257/98 |
| 2013/0248894 A1* | 9/2013 | Nakamura | H01L 33/486 |
| | | | 257/88 |
| 2018/0062057 A1* | 3/2018 | Sweegers | H01L 33/64 |

* cited by examiner

FLIP CHIP TYPE LIGHT-EMITTING DIODE AND METHOD FOR MANUFACTURING THE SAME

RELATED APPLICATIONS

This application claims priority to Taiwan Application Serial Number 106102142, filed Jan. 20, 2017, which is herein incorporated by reference.

BACKGROUND

Field of Invention

The present invention relates to a method for manufacturing a light-emitting device. More particularly, this invention presents a flip chip structure for light-emitting diodes (LEDs), exhibiting the nature of isolating the heat conduction from the electrical conduction, and a method for manufacturing the same.

Description of Related Art

Due to the rapid progress of luminous efficacy, including lm/Watt and lm/dollar, penetration rate of LEDs lighting applications reaches over 36% in recent years. However, progress of the LEDs efficacy improvement becomes saturated gradually. Generally, commercial LEDs have a power conversion efficiency about 40%, which implies that about 60% of the input electrical power will be converted into the system heat. The generated heat flow through the limited LEDs area results in a significant junction temperature rise, which will degrade both the phosphor conversion efficiency and encapsulant material. Such phenomenon becomes more severe as the input power increases or the module dimension shrinks. There is always a design challenge to balance the thermal management cost and the entire system reliability. Reducing the thermal resistance through the small LED chip area is a key to solve this problem. Here we present a chip structure conducting the LED generated heat directly from the epitaxy surface to the carrier board of emitter module. In addition, the conduction path of the generated heat is electrically isolated from the current flow path. Such nature facilitates the emitter module design with very low thermal resistance. Detailed descriptions will be shown in the following.

FIG. 1 depicts a schematic cross-sectional view of a conventional light-emitting diode package structure 100, which comprises a light-emitting diode 110, an adhesive paste 120, a lead frame 130, a solder paste 140, a metal core printed circuit board (MCPCB) 150, and a heat sink 160. The light-emitting diode 110 mainly includes a substrate 112, an N-type semiconductor layer 114, an active layer 116, a P-type semiconductor layer 118, an N-type electrode 114a, and a P-type electrode 118a. The N-type semiconductor layer 114 is disposed on the substrate 112, the active layer 116 is disposed on a portion of the N-type semiconductor layer 114, and the P-type semiconductor layer 118 is disposed on the active layer 116. The N-type electrode 114a is disposed on another portion of the N-type semiconductor layer 114, and the P-type electrode 118a is disposed on the P-type semiconductor layer 118. The adhesive paste 120 is adhered between the substrate 112 and the lead frame 130 to fix the light-emitting diode 110 to the lead frame 130. The lead frame 130 has two electrodes 132 and 134. The N-type electrode 114a and the P-type electrode 118a of the light-emitting diode 110 are electrically connected to the electrodes 132 and 134 of the lead frame 130 respectively through two wires 114b and 118b.

The metal core printed circuit board 150 includes a metal substrate 152, an insulation layer 154, and two metal electrodes 156. The insulation layer 154 is disposed on the metal substrate 152, and the two metal electrodes 156 are disposed on the insulation layer 154. The two metal electrodes 156 of the metal core printed circuit board 150 are connected to the electrodes 132 and 134 of the lead frame 130 by using two solder paste 140, so as to connect the light-emitting diode 110 to the metal core printed circuit board 150. The heat sink 160 is disposed on the other side of the metal substrate 152 which is opposite to the insulation layer 154.

In the light-emitting diode package structure 100, the insulation layer 154 of the metal core printed circuit board 150 functions as a barrier to isolate the heat conduction from the electrical conduction. The generated heat flows through the insulation layer 154 and arrive the metal substrate 152 of the metal core printed circuit board 150. Finally, the heat is dissipated to the environment via the heat sink 160. Along the heat flow direction, three thermal resistance should be considered :(1) the light-emitting diode substrate 112 (2) the adhesive paste 120, and (3) the insulation layer 154 of the metal core printed circuit board 150.

To reduce the thermal resistance of the conventional light-emitting diode package structure 100, flip chip technique was proposed. FIG. 2 illustrates the schematic cross-sectional view of flip chip type light-emitting diode package structure 200, including a light-emitting diode 210, a ceramic substrate 220, a solder paste 230, a metal core printed circuit board 240, and a heat sink 250.

The light-emitting diode 210 mainly includes a substrate 212, an N-type semiconductor layer 214, an active layer 216, a P-type semiconductor layer 218, and a P-type metal reflection mirror 218a. The N-type semiconductor layer 214 is disposed on the substrate 212, the active layer 216 is disposed on a portion of the N-type semiconductor layer 214, the P-type semiconductor layer 218 is disposed on the active layer 216, and the P-type metal reflection mirror 218a is disposed on a majority of the P-type semiconductor layer 218. The ceramic substrate 220 includes a ceramic board 222, and two electrodes 224 and 226, in which the electrodes 224 and 226 extend from a surface of the ceramic board 222 to an opposite surface of the ceramic board 222 and pass through the ceramic board 222 respectively through two through holes 222a and 222b, which pass through the ceramic board 222.

In the flip chip type light-emitting diode package structure 200, the light-emitting diode 210 further includes a dielectric layer 260 covering the P-type metal reflection mirror 218a, the exposed N-type semiconductor layer 214, the exposed active layer 216, and the exposed P-type semiconductor layer 218. The dielectric layer 260 is formed with two holes 260a and 260b, in which the holes 260a and 260b pass through the dielectric layer 260 to respectively expose a portion of the N-type semiconductor layer 214 and a portion of the P-type metal reflection mirror 218a. The light-emitting diode 210 further includes an N-type electrode 262 and a P-type electrode 264, in which the N-type electrode 262 and the P-type electrode 264 are located on the dielectric layer 260, and respectively fill the holes 260a and 260b to contact the exposed portion of the N-type semiconductor layer 214 and the exposed portion of the P-type metal reflection mirror 218a. The light-emitting diode 210 is faced down to make the N-type electrode 262 and the P-type electrode 264 bonded to the electrodes 224 and 226 of the ceramic substrate 220 by using a eutectic method.

The metal core printed circuit board 240 includes a metal substrate 242, an insulation layer 244, and two metal electrodes 246 and 248. The insulation layer 244 is disposed on the metal substrate 242, and the two metal electrodes 246 and 248 are disposed on the insulation layer 244. The two metal electrodes 246 and 248 are connected to the electrodes 224 and 226 of the ceramic substrate 220 by using two solder pastes 230, so as to connect the light-emitting diode 210 to the metal core printed circuit board 240. The heat sink 250 is disposed on a side of the metal substrate 242 opposite to the insulation layer 244.

In the flip chip type light-emitting diode package structure 200, the active layer 216 is very close to the surface P-type layer 218 (the distance is typically smaller than 0.5 μm), such that the heat power 270 generated mainly in the active layer 216 due to the non-radiative recombination mechanism will flow vertically from the P-type metal reflection mirror 218a at the surface of the light-emitting diode 210 to the electrode 226 of the ceramic substrate 220, through the P-type electrode 264 which extends through the dielectric layer 260. The heat flow path from the active layer 216 to the electrode 226 of the ceramic substrate 220 is formed by metal material. Therefore, the thermal resistance can be greatly reduced as compared to the conventional structure 100, where both the LED substrate 112 and the adhesive paste 120 contribute much higher thermal resistance than metal material. As depicted in FIG. 2 for P-side, the heat power 270 spreads horizontally via the electrode 226 and the ceramic board 222 and then flows downward to the solder pastes 230 via the through hole 222b of the electrode 226. Eventually, the heat power 270 is transferred to the metal substrate 242 through the solder pastes 230 and the insulation layer 244 of the MCPCB 240, and then is dissipated to the environment via the heat sink 250. The heat transfer mechanism in the N-side is the same.

Ensemble thermal resistance of the flip chip type light-emitting diode package structure 200 is about one third of that of the conventional light-emitting diode package structure 100. Such merit extends the linearity of L-I curve for the flip chip type LED structure 200, thus enables double drive current in real lighting applications.

Thermal resistance resulting from the insulation layer 244 of the MCPCB 240 becomes ultimately important to further improve the heat transfer characteristic for the flip chip type light-emitting diode package structure 200. Note that both the conventional light-emitting diode package structure 100 and the flip chip type light-emitting diode package structure 200 can't help isolating the thermal conduction from the electrical conduction, thus the insulation layer 244 is necessary. However, the insulation layer 244 has a poor horizontal spreading capability for heat flow, that implies the hot-spot phenomenon is inevitable. Double the flip chip drive current means a double heat power flowing through the insulation layer 244, that might make the situation more severe. In addition, thermal resistance across the insulation layer 244 still remains as an unsolved problem the same as the conventional light-emitting diode package structure 100, where the insulation layer 154 is one of the three major sources of thermal resistance.

SUMMARY

Therefore, one objective of the present invention is to provide a flip chip type light-emitting diode having a thermal-electrical separated structure, so as to solve the side effect of doubling the drive current for the conventional flip chip type package structure 200.

Another objective of the present invention is to provide a flip chip type light-emitting diode and a method for manufacturing the same, in which the chip structure mainly possesses an electrically isolated heat-transfer layer with high thermal conductivity and a two-level metal interconnection structure to form an extra pad on a chip surface, named as a heat-dissipating pad. The generated heat in the active layer can be transported from the insulated heat-transfer layer to the heat-dissipating pad on the chip surface via the two-level metal interconnection structure. Such heat-dissipating path exhibits a thermal-electrical separated nature, thereby facilitating a modification for the original MCPCB structure and material. Such modification can not only improve the thermal performance for a flip-chip type light-emitting diode but also lower the manufacturing cost.

Still another objective of the present invention is to provide a flip chip type light-emitting diode and a method for manufacturing the same, in which a heat-dissipating electrode on the carrier of a circuit board may extend from the carrier's front side to the back side using a through-hole structure. Hence, the heat can flow from the heat-dissipating pad on the chip surface to the back side of carrier board, through the heat-dissipating electrode of carrier board.

According to the aforementioned objectives, the present invention provides a flip chip type light-emitting diode. The flip chip type light-emitting diode includes a light-emitting diode structure, a first dielectric layer, a first-level metal interconnect at least divided into a first block, a second block and a third block spatially separated, a second dielectric layer, at least one first bonding pad structure, at least one second bonding pad structure, and at least one heat-dissipating pad structure, and a circuit board. The light-emitting diode structure includes a substrate, a first conductivity type semiconductor layer, an active layer, a second conductivity type semiconductor layer, a first contact metal layer, a second contact metal layer, and an insulated heat-transfer layer. The first conductivity type semiconductor layer is disposed on the substrate. The active layer is disposed on a first portion of the first conductivity type semiconductor layer. The second conductivity type semiconductor layer is disposed on the active layer. The first contact metal layer is disposed on a second portion of the first conductivity type semiconductor layer. The second contact metal layer is disposed on the second conductivity type semiconductor layer. The insulated heat-transfer layer is disposed on a first portion of the second contact metal layer. The first dielectric layer covers the light-emitting diode structure, in which the first dielectric layer has at least one first hole exposing a portion of the first contact metal layer, at least one second hole exposing a portion of the second contact metal layer, and at least one third hole exposing a portion of the insulated heat-transfer layer. Three blocks of the first-level metal interconnect respectively fill the first hole, the second hole, and the third hole. The second dielectric layer covering the first dielectric layer and the at least three blocks of the first-level metal interconnect has at least one fourth hole exposing a portion of the first block of the first-level metal interconnect, at least one fifth hole exposing a portion of the second block of the first-level metal interconnect, and at least one sixth hole exposing a portion of the third block of the first-level metal interconnect. The first bonding pad structure, the second bonding pad structure, and the heat-dissipating pad structure are separated from each other and respectively extends from the fourth hole, the fifth hole, and the sixth hole to a surface of the second dielectric layer. The circuit board includes a carrier, and a first electrode, a second electrode, and a heat-dissipating electrode which are separated from each other and are disposed on a first surface of the carrier, in which the first bonding pad structure, the second bonding pad structure, and the heat-dissipating pad structure are respectively disposed on the first electrode, the second electrode, and the heat-dissipating electrode.

According to one embodiment of the present invention, a material of the insulated heat-transfer layer is AlN, $Al_2O_3$, BeO, or MgO.

According to one embodiment of the present invention, the carrier is a ceramic board, a printed circuit board, or an integrated circuit package carrier.

According to one embodiment of the present invention, the circuit board can be one of the materials listed in the paragraph [0018]. There is a through hole extending from the first surface of the circuit board to the second surface. Furthermore, the first electrode and the second electrode are located on the first surface of the circuit board, and the thermal pad extends from the first surface to the second surface.

According to one embodiment of the present invention, the circuit board is a metal core printed circuit board, and the circuit board further includes an insulation layer disposed on the first surface of the carrier, in which the insulation layer has at least one contact hole exposing a portion of the first surface of the carrier, the first electrode and the second electrode are located on a surface of the insulation layer, and the heat-dissipating electrode extends from the surface of the insulation layer through the contact hole and is connected to a portion of the first surface of carrier.

According to one embodiment of the present invention, forming the second contact metal layer includes forming an ohmic contact metal layer on the second conductivity type semiconductor layer, and forming a diffusion barrier layer to enclose the ohmic contact metal layer.

According to one embodiment of the present invention, a material of the diffusion barrier layer is platinum (Pt), titanium tungsten (TiW), titanium nitride or a combination thereof.

According to one embodiment of the present invention, two levels of metal interconnect conduct the electrical current to the bonding pads and the generated heat to the heat-dissipating pad. The first-level metal interconnect with at least three blocks respectively connect the at least one first hole, the at least one second hole, and the at least one third hole. The second-level metal interconnect forms three blocks respectively connect the at least one fourth hole, the at least one fifth hole, and the at least one sixth hole. Along the vertical direction, a dislocation-like arrangement is formed between the first holes and the fourth holes. Furthermore, the first holes are actually connected to the fourth holes by the first block of the first-level metal interconnect. The second holes and the fifth holes are also dislocated along the vertical direction but connected by the second block of the first-level metal interconnect. The third holes and the sixth holes are also dislocated along the vertical direction but connected by the third block of the first-level metal interconnect.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
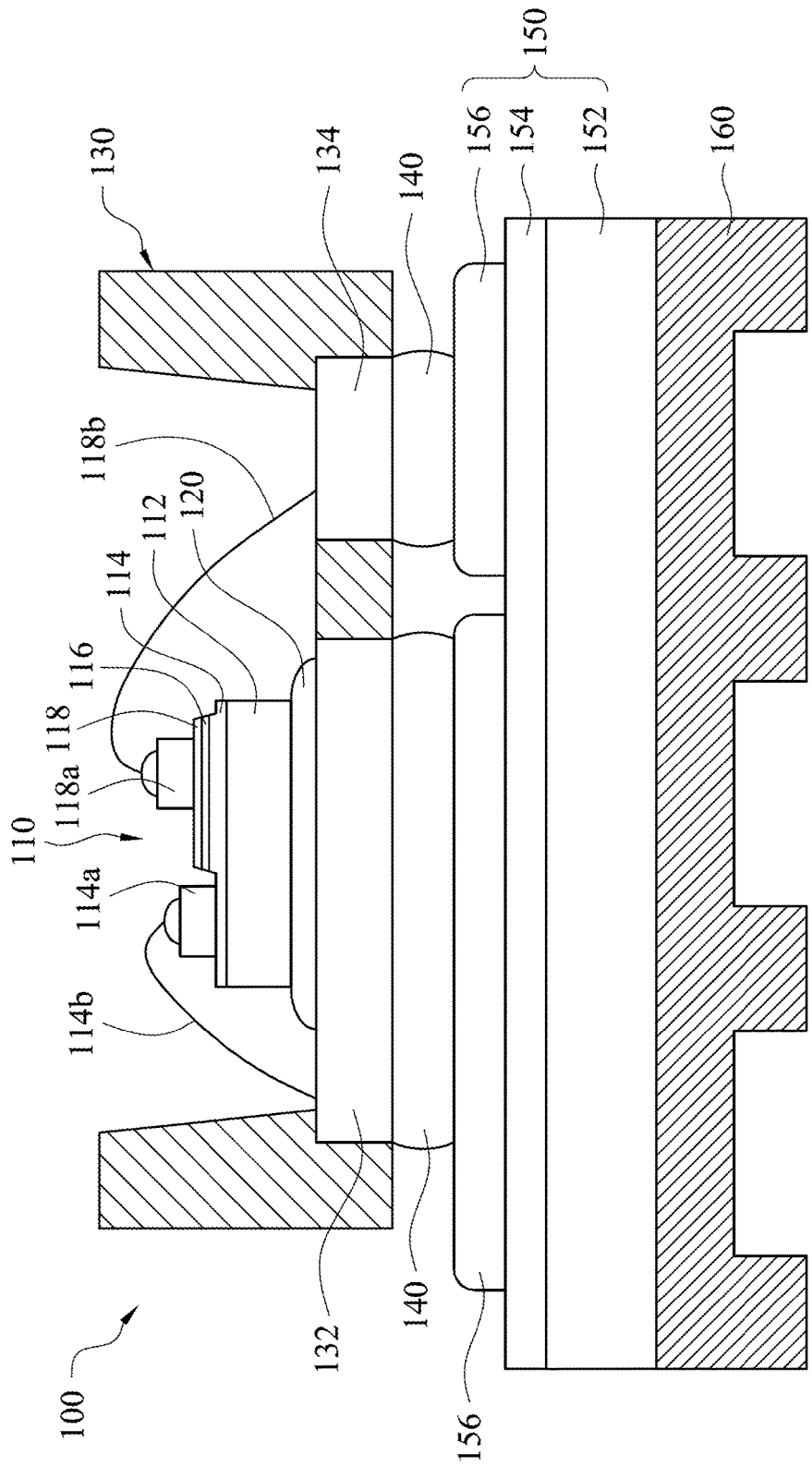
FIG. 1 depicts a schematic cross-sectional view of a conventional light-emitting diode package structure.
Figure 2:
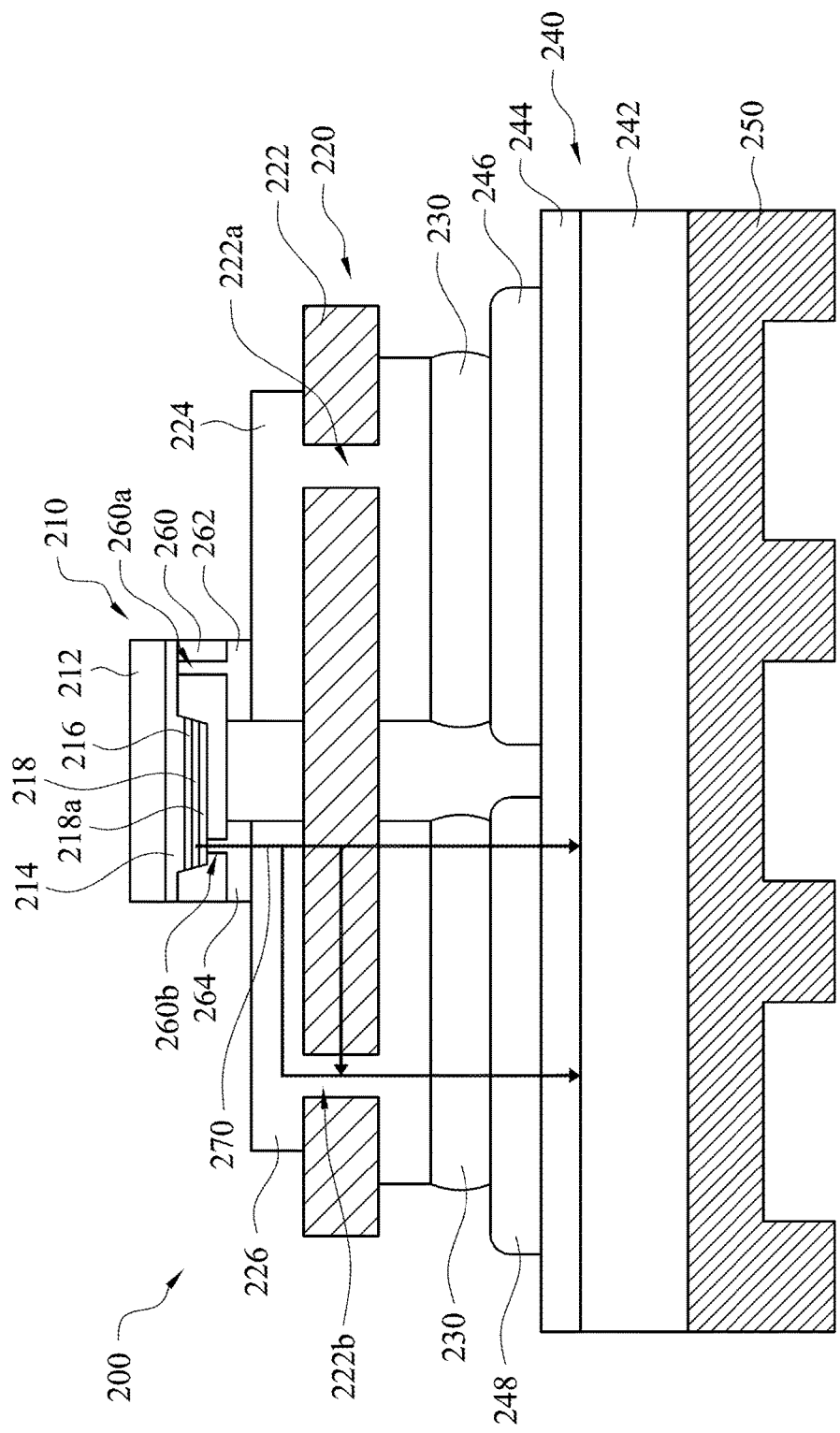
FIG. 2 illustrates a schematic cross-sectional view of a conventional flip chip type light-emitting diode package structure.
Figure 3:
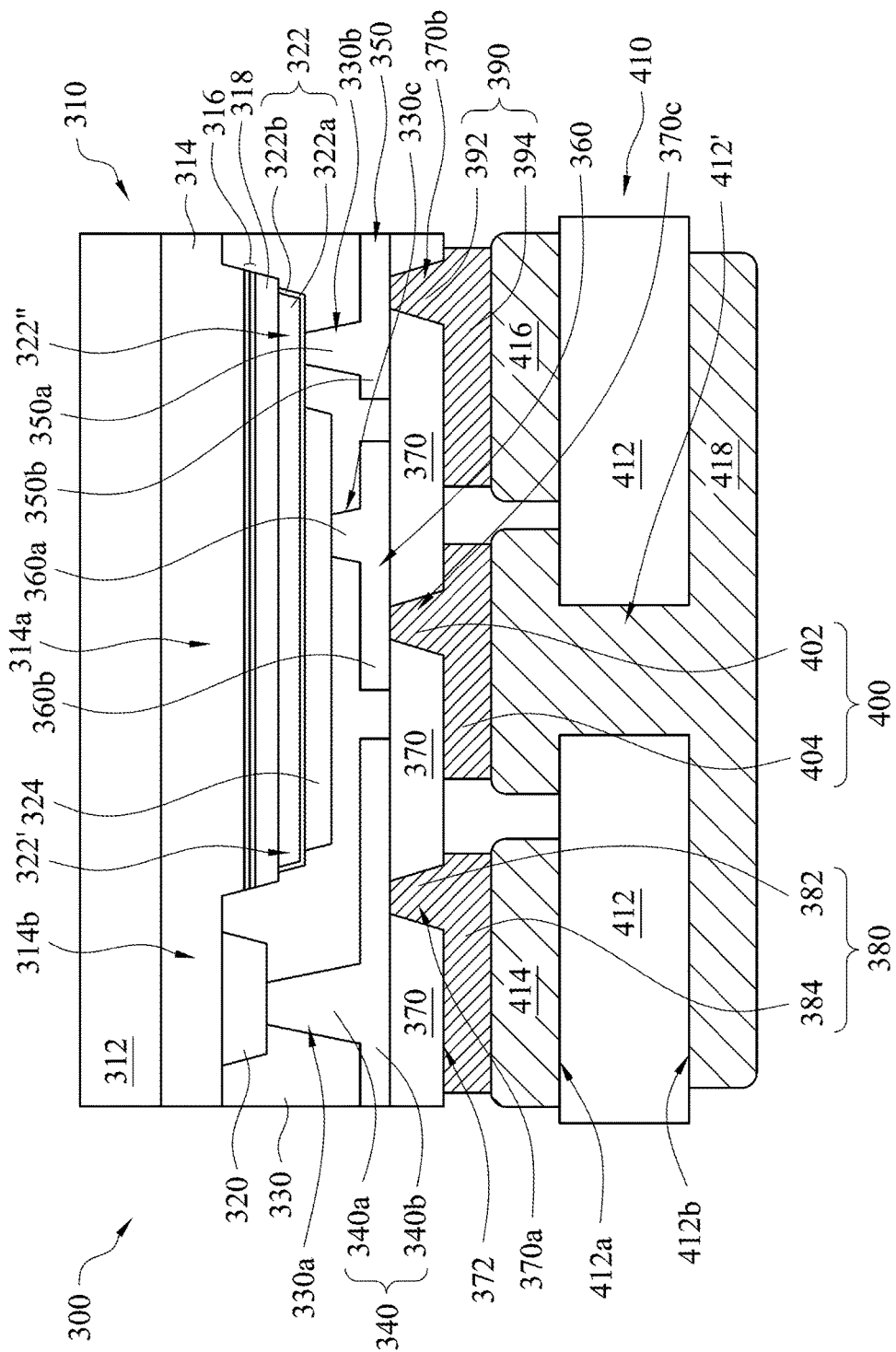
FIG. 3 depicts a schematic cross-sectional view of a flip chip type light-emitting diode package structure in accordance with one embodiment of the present invention.

FIG. 3 depicts a schematic cross-sectional view of a flip chip type light-emitting diode package structure in accordance with one embodiment of the present invention. A flip chip type light-emitting diode 300 exhibits a nature of thermal-electrical separation. In some examples, the flip chip type light-emitting diode 300 may mainly include a light-emitting diode structure 310, a first dielectric layer 330, at least one first-level metal interconnect divided into three blocks 340, 350 and 360, a second dielectric layer 370, at least one first bonding pad structure 380, at least one second bonding pad structure 390, at least one heat-dissipating pad structure 400, and a circuit board 410.

In some examples, as shown in FIG. 3, the light-emitting diode structure 310 may mainly include a substrate 312, a first conductivity type semiconductor layer 314, an active layer 316, a second conductivity type semiconductor layer 318, a first contact metal layer 320, a second contact metal layer 322, and an insulated heat-transfer layer 324. The substrate 312 is a transparent substrate, such as a sapphire substrate.

For example, the first conductivity type semiconductor layer 314, the active layer 316, the second conductivity type semiconductor layer 318 may be deposited by an epitaxy method. The first conductivity type semiconductor layer 314 is disposed on the substrate 312. A material of the first conductivity type semiconductor layer 314 may be, for example, III-V group compound semiconductor. The first conductivity type semiconductor layer 314 may have a first portion 314a and a second portion 314b. The active layer 316 is disposed on the first portion 314a of the first conductivity type semiconductor layer 314, such that the second portion 314b of the first conductivity type semiconductor layer 314 is exposed. For example, the active layer 316 may include various stacked semiconductor layers. In some exemplary examples, the active layer 316 may include a multiple quantum well (MQW) structure. The second conductivity type semiconductor layer 318 is disposed on the active layer 316. A material of the second conductivity type semiconductor layer 318 may be, for example, III-V group compound semiconductor.

In the light-emitting diode structure 310, the first conductivity type semiconductor layer 314 and the second conductivity type semiconductor layer 318 have opposite conductivity types.

Referring to FIG. 3 again, the first contact metal layer 320 is disposed on a portion of the exposed second portion 314b of the first conductivity type semiconductor layer 314 and is separated from both the active layer 316 and the second conductivity type semiconductor layer 318 by a distance. The first contact metal layer 320 preferably forms an electrical ohmic contact to the first conductivity type semiconductor layer 314.

The second contact metal layer 322 is disposed on the second conductivity type semiconductor layer 318. The second contact metal layer 322 forms an electrical ohmic contact to the second conductivity type semiconductor layer 318. In some examples, the second contact metal layer 322 may also behave as a metal mirror simultaneously and is located on a majority of the second conductivity type semiconductor layer 318 to reflect the light emitted from the active layer 316 toward the substrate 312. In some exemplary examples, the second contact metal layer 322 may include an ohmic contact metal layer 322a and a diffusion barrier layer 322b. The ohmic contact metal layer 322a is disposed on the second conductivity type semiconductor layer 318, and preferably has a high reflectivity to effectively reflect the emitted light toward the substrate 312. A material of the ohmic contact metal layer 322a may be, for example, silver or aluminum. The ohmic contact metal layer 322a is enclosed by the diffusion barrier 322b to prevent the out-diffusion risk caused by the subsequent process thermal budget, that could degrade both the contact resistance and reflectivity. For example, a material of the diffusion barrier layer 322b may be platinum (Pt), titanium tungsten (TiW), titanium nitride or a stacked combination thereof.

As shown in FIG. 3, the second contact metal layer 322 has a first portion 322' and a second portion 322". The insulated heat-transfer layer 324 is disposed on the first portion 322' of the second contact metal layer 322. The second portion 322" of the second contact metal layer 322 is exposed for the second block 350 of the first-level metal interconnect, which connects to the second contact metal layer 322. Role of the insulated heat-transfer layer 324 is to create a thermal conduction path which is electrically isolated, so as to form a thermal-electrical separated light-emitting diode structure 310. The insulated heat-transfer layer 324 should have the material properties of not only high thermal conductivity but also high electrical resistivity. A ceramic thin film such as AlN, $Al_2O_3$, BeO, or MgO could be the good candidates for the insulated heat-transfer layer 324.

The first dielectric layer 330 covers the light-emitting diode structure 310, that is the first dielectric layer 330 covers the insulated heat-transfer layer 324, the exposed portion of the second contact metal layer 322, the exposed portion of the first contact metal layer 320, the exposed portion of the first conductivity type semiconductor 314, the exposed portion of the second conductivity type semiconductor 318 and the exposed portion of the active layer 316. The first dielectric layer 330 may be also referred as an interlayer dielectric (ILD) layer providing an electrical insulation between three blocks of the first-level metal interconnect. For example, a material of the first dielectric layer 330 may be $SiO_2$, $Si_3N_4$, or $TiO_2/SiO_2$ stack.

In some examples, as shown in FIG. 3, the first dielectric layer 330 has at least one first hole 330a, at least one second hole 330b, and at least one third hole 330c, which pass through the first dielectric layer 330 to respectively expose a portion of the first contact metal layer 320, a portion of the second contact metal layer 322, and a portion of the insulated heat-transfer layer 324.

The first-level metal interconnect are divided into three blocks 340, 350, and 360, respectively corresponding to the first hole 330a, the second hole 330b, and the third hole 330c. In some examples, the block 340 includes at least one via 340a and a landing pad 340b connected to each other, the block 350 includes at least one via 350a and a landing pad 350b connected to each other, and the block 360 includes at least one via 360a and a landing pad 360b connected to each other. Materials of the three blocks 340, 350, and 360 in the first-level metal interconnect may be the same. In certain examples, materials of the three blocks 340, 350, and 360 may be formed from different materials. For example, the materials of the blocks 340, 350, and 360 may be Ti, Ni, Cr, Al, Au, or Pt.

In some exemplary examples, the block 340 is an N-type metal interconnect, the block 350 is a P-type metal interconnect. The landing pad 340b of the block 340 for N-type metal interconnect actually occupies a great portion of area on the first dielectric layer 330 to spread the injected electron current uniformly along the horizontal direction. The second contact metal 322 underlying the first dielectric layer 330 also occupies a great portion of the chip area, on which the second conductivity type semiconductor layer 318 is exposed, to spread the injected hole current uniformly along the horizontal direction. Because of the excellent current spreading capability of both the block 340 and the second contact metal layer 322, the light-emitting diode structure 310 can be operated under a higher current density. The block 340 for N-type metal interconnect have the area close to that of the second contact metal 322, hence the sheet resistance matching can be easily achieved by simply adjusting their thicknesses. Such sheet resistance matching characteristic can not only produce a uniform spatial distribution for the emitted light from the active layer 316 but also lower the operation voltage, thus enhancing the luminous efficacy for the light-emitting diode structure 310.

Referring to FIG. 3 again, the second dielectric layer 370 covers the first dielectric layer 330 and the three blocks 340, 350, and 360 of the first-level metal interconnect. The second dielectric layer 370 may be also referred as an interlayer dielectric layer. For example, a material of the second dielectric layer 370 may be $SiO_2$, $Si_3N_4$, or $TiO_2/SiO_2$ stack.

In some examples, the second dielectric layer 370 has at least one fourth hole 370a, at least one fifth hole 370b, and at least one sixth hole 370c, in which the fourth hole 370a, the fifth hole 370b, and the sixth hole 370c all pass through the second dielectric layer 370, and the fourth hole 370a, the fifth hole 370b, and the sixth hole 370c respectively expose a portion of the landing pad 340b of the block 340 in the first-level metal interconnect, a portion of the landing pad 350b of the block 350 in the first-level metal interconnect, and a portion of the landing pad 360b of the block 360 in the first-level metal interconnect. The fourth hole 370a, the fifth hole 370b, and the sixth hole 370c may be also referred as via holes.

The first bonding pad structure 380, the second bonding pad structure 390, and the heat-dissipating pad structure 400 respectively fill the fourth hole 370a, the fifth hole 370b, and the sixth hole 370c, and extend to a surface 372 of the second dielectric layer 370, and are separated from each other. In some examples, as shown in FIG. 3, the first bonding pad structure 380, the second bonding pad structure 390, and the heat-dissipating pad structure 400 respectively include a via 382 and a bonding pad 384, a via 392 and a bonding pad 394, and a via 402 and a heat-dissipating pad 404, in which the vias 382, 392, and 402 respectively fill the fourth hole 370a, the fifth hole 370b, and the sixth hole 370c, and the bonding pads 384 and 394 and the heat-dissipating pad 404 are all located on the surface 372 of the second dielectric layer 370. Materials of the first bonding pad structure 380, the second bonding pad structure 390, and the heat-dissipating pad structure 400 may be the same. In certain examples, the first bonding pad structure 380, the second bonding pad structure 390, and the heat-dissipating pad structure 400 may be formed from different materials. For example, the materials of the first bonding pad structure 380, the second bonding pad structure 390, and the heat-dissipating pad structure 400 mat be Ti, Ni, Cr, Al, Au, AuSn alloy (Au Sn), or Pt.

In some exemplary examples, dislocated arrangements along the vertical direction are formed between the first hole 330a and the fourth hole 370a, the second hole 330b and the fifth hole 370b, the third hole 330c and the sixth hole 370c, respectively. Such arrangement makes the vias 382, 392, and 402 respectively land on the flat portions of the landing pads 340b, 350b, and 360b, so as to obtain a better adhesion strength.

The circuit board 410 includes a carrier 412, a first electrode 414, a second electrode 416, and a heat-dissipating electrode 418. The carrier 412 may be a ceramic board, a printed circuit board, or an integrated circuit package carrier, in which a material of the ceramic board may be aluminum oxide or aluminum nitride, and the integrated circuit package carrier may be a bismaleimide triazine (BT) resin substrate, an ajinomoto build-up film (ABF), or a copper connection in molding (C2iM), for example. The carrier 412 has a first surface 412a and a second surface 412b, which are opposite to each other.

The first electrode 414, the second electrode 416, and the heat-dissipating electrode 418 are disposed on the first surface 412a of the carrier 412, and are separated from each other. The first electrode 414, the second electrode 416, and the heat-dissipating electrode 418 may be formed from the same material, or may be formed from different materials. The first electrode 414, the second electrode 416, and the heat-dissipating electrode 418 may be metal. In addition, the first bonding pad 384, the second bonding pad 394, and the heat-dissipating pad 404 are respectively disposed on the first electrode 414, the second electrode 416, and the heat-dissipating electrode 418. In some exemplary examples, as shown in FIG. 3, the carrier 412 has a through hole 412', extending from the first surface 412a of the carrier 412 to the second surface 412b. Furthermore, the heat-dissipating electrode 418 extends from the first surface 412a of the carrier 412 to the second surface 412b through the through hole 412'. For example, the heat-dissipating electrode 418 is located on a portion of the first surface 412a, passes through the through hole 412', and extends over a great portion of the second surface 412b to increase the heat-dissipating efficiency of the heat-dissipating electrode 418.

Referring to FIG. 3 again, such structural design can form a structure in which electrical and thermal conductions are separated inside the light-emitting diode structure 310 and then conducted horizontally on the front side and the back side of the circuit board 410 respectively, hence the heat-dissipating design for a lighting system using the flip chip type lighting-emitting diode 300 can be simplified, thus reducing the manufacture cost. In addition, the low thermal resistance property of the flip chip type light-emitting diode 300 can reduce the junction temperature and then enhance the operation reliability and lifetime for a lighting system.

Figure 4:
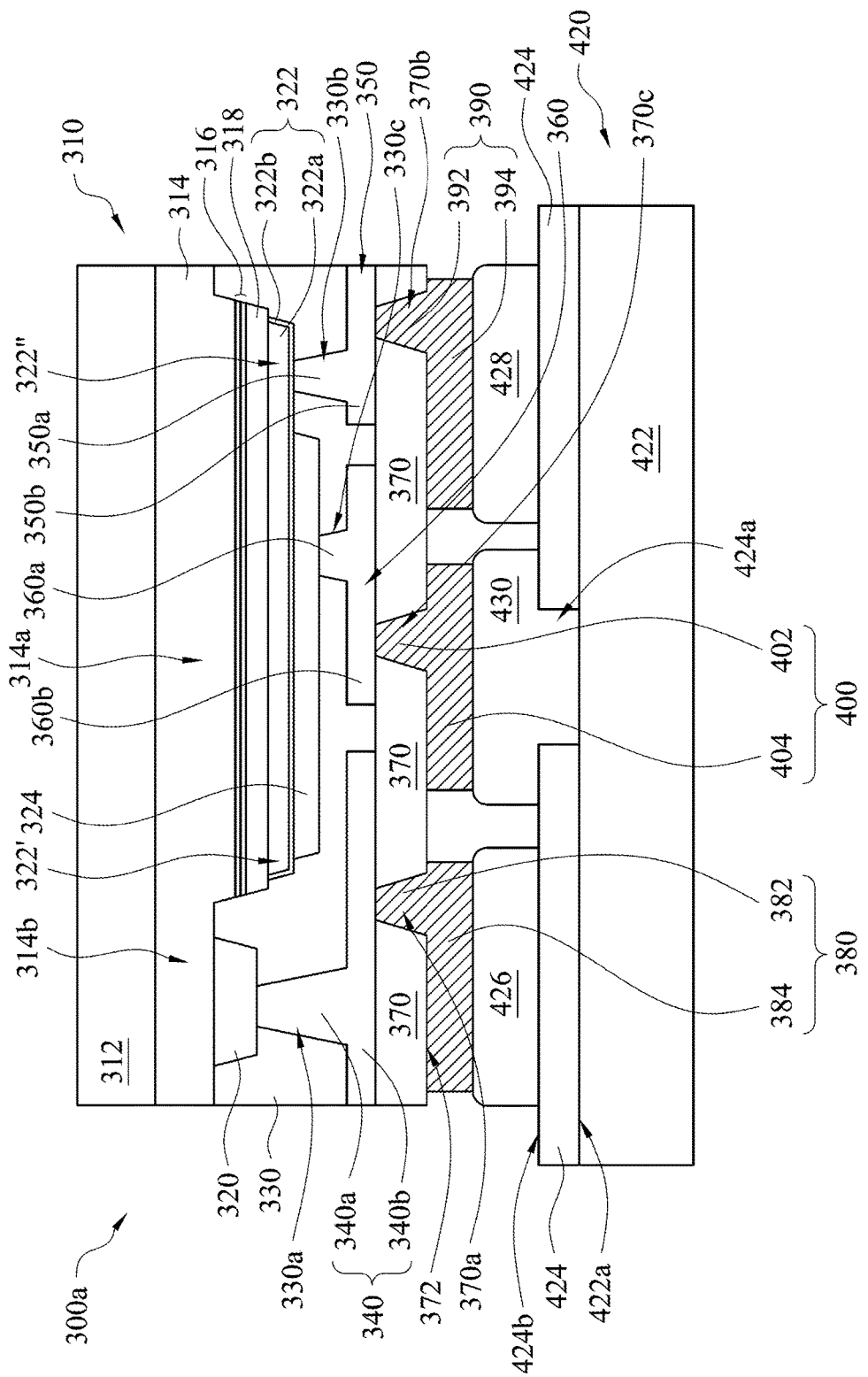
FIG. 4 depicts a schematic cross-sectional view of a flip chip type light-emitting diode in accordance with one embodiment of the present invention.

FIG. 4 depicts a schematic cross-sectional view of a flip chip type light-emitting diode in accordance with one embodiment of the present invention. A structure of a flip chip type light-emitting diode 300a is substantially similar to that of the flip chip type light-emitting diode 300 in the aforementioned embodiment, and the difference between the flip chip type light-emitting diodes 300a and 300 is that a circuit board 420 of the flip chip type light-emitting diode 300a is different from the circuit board 410 of the flip chip type light-emitting diode 300.

In the flip chip type light-emitting diodes 300a, the circuit board 420 is a metal core printed circuit board (MCPCB). In some exemplary examples, the circuit board 420 mainly includes a carrier 422, an insulation layer 424, a first electrode 426, a second electrode 428, and a thermal pad electrode 430. The bonding pad 384, the bonding pad 394, and the heat-dissipating pad 404 are respectively disposed on the first electrode 426, the second electrode 428, and the heat-dissipating electrode 430.

The carrier 422 is a metal plate. The carrier 422 has a first surface 422a and a second surface 422b opposite to each other. The insulation layer 424 is disposed on the first surface 422a of the carrier 422. There is at least a contact hole 424a passing through the insulation layer 424 to expose a portion of the first surface 422a of the carrier 422. The first electrode 426, the second electrode 428, and the heat-dissipating electrode 430 are located on a surface 424b of the insulation layer 424, and are separated from each other. In addition, the heat-dissipating electrode 430 extends from the surface 424b of the insulation layer 424 through the contact hole 424a to contact the exposed portion of the first surface 422a of the carrier 422. Thus, the heat power can be transferred to the external environment via the carrier 422.

Figure 5A:
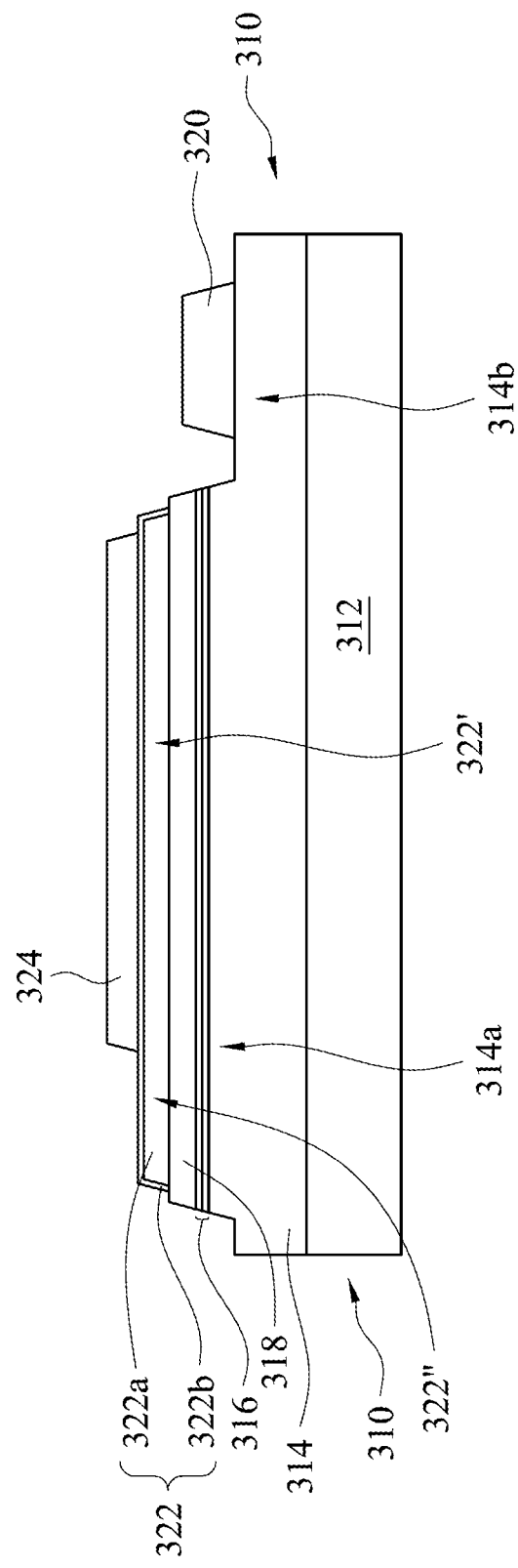
FIG. 5A through FIG. 5C depict the schematic cross-sections for various intermediate stages as fabricating a flip chip type light-emitting diode in accordance with one embodiment of the present invention.
Figure 5B:
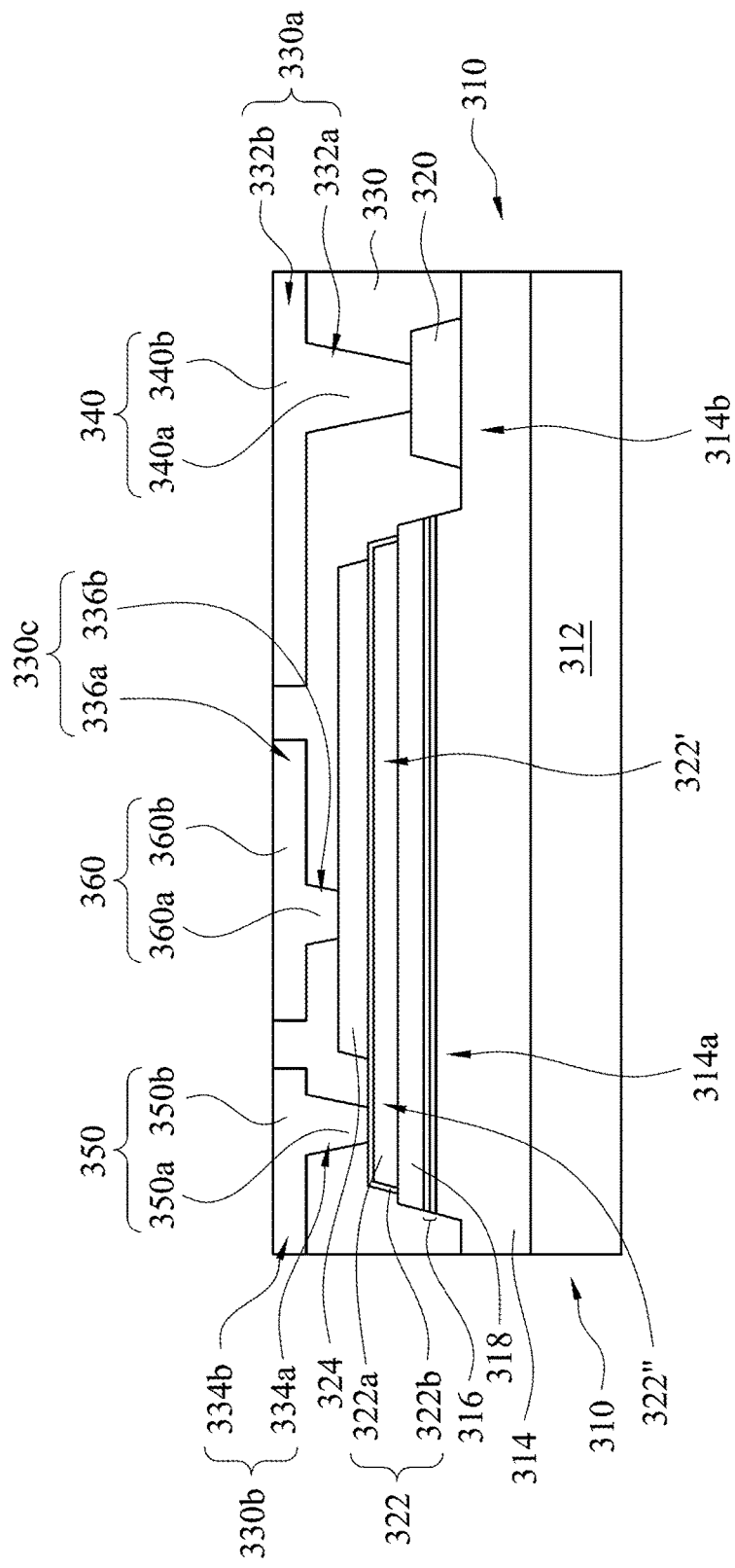
Figure 5C:
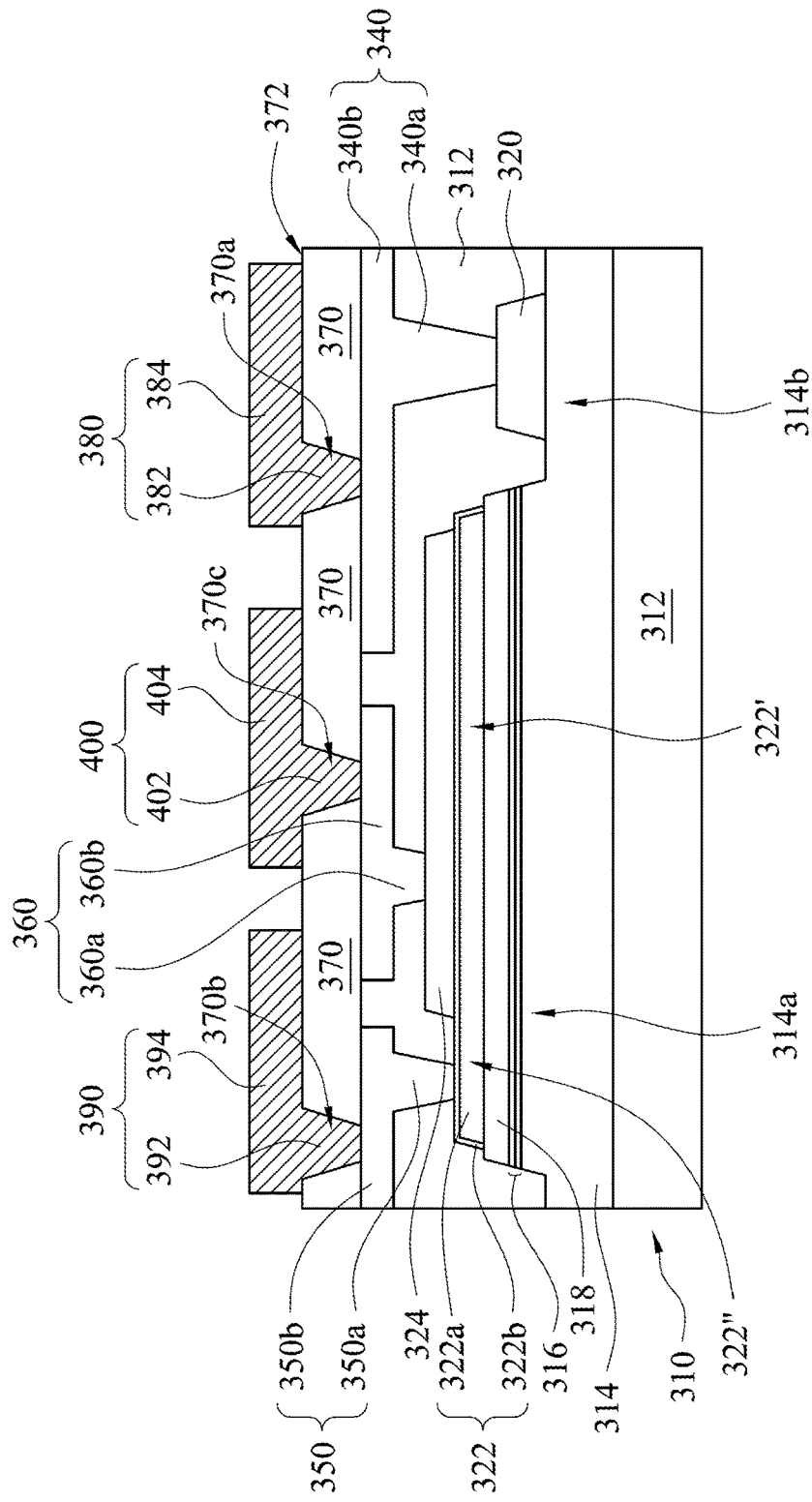
Figure 6:
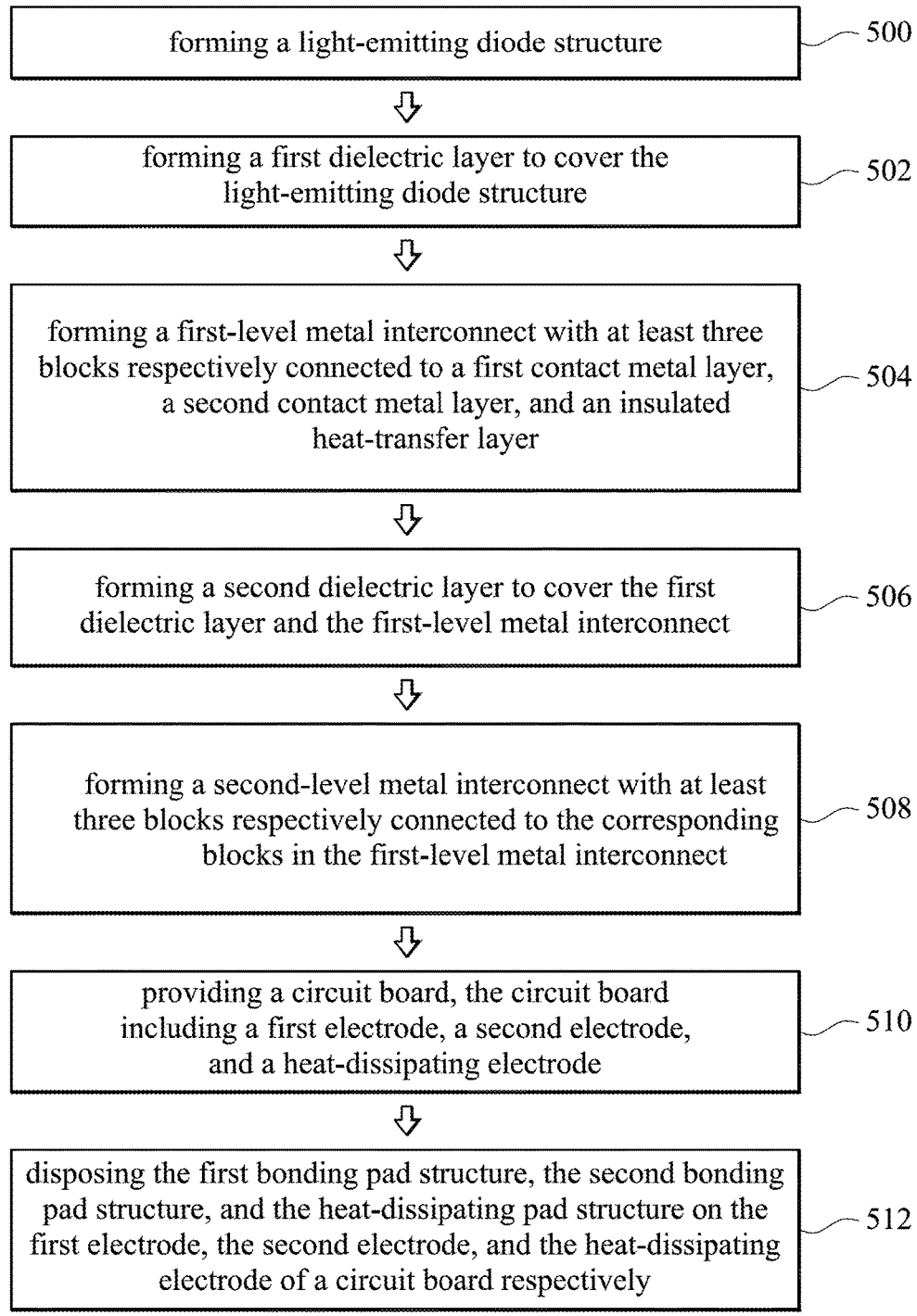
FIG. 6 is the flow chart describing the steps for fabricating a flip chip type light-emitting diode in accordance with one embodiment of the present invention.

Referring to FIG. 5A through FIG. 5C and FIG. 6, FIG. 5A through FIG. 5C depict the schematic cross-sections for various intermediate stages as fabricating a flip chip type light-emitting diode in accordance with one embodiment of the present invention. FIG. 6 is the flow chart describing the steps for fabricating a flip chip type light-emitting diode in accordance with one embodiment of the present invention. To fabricate the flip chip type light-emitting diode 300 shown in FIG. 3, step 500 needs to be performed first. In some examples, forming the light-emitting diode structure 310 includes forming a first conductivity type semiconductor layer 314 on a substrate 312, forming an active layer 316 on the first conductivity type semiconductor layer 314, and forming a second conductivity type semiconductor layer 318 on the active layer 316 by using, for example, an epitaxy growth method. The second conductivity type semiconductor layer 318, the active layer 316, and the first conductivity type semiconductor layer 314 are patterned by using, for example, a lithography-and-etch process, that removes a portion of the second conductivity type semiconductor layer 318, a portion of the active layer 316, and a portion of the first conductivity type semiconductor layer 314 to expose the second portion 314b of the first conductivity type semiconductor layer 314.

Next, a second contact metal layer 322 is formed on the second conductivity type semiconductor layer 318, and the second contact metal layer 322 forms an electrical ohmic contact to the second conductivity type semiconductor layer 318. The second contact metal layer 322 may also play the role of metal reflector and is located on a majority of the second conductivity type semiconductor layer 318. In some exemplary examples, the ohmic contact metal layer 322a may be formed first on the second conductivity type semiconductor layer 318, and then a diffusion barrier layer 322b may be formed to enclose the ohmic contact metal layer 322a. High optical reflectivity property is preferable to the ohmic contact metal 322a. The diffusion barrier layer 322b can prevent the ohmic contact metal layer 322a from out-diffusion phenomenon, that can degrade not only the contact resistance but also the optical reflectivity of the ohmic contact metal layer 322a.

In addition, a first contact metal layer 320 is formed on the second portion 314b of the first conductivity type semiconductor layer 314 by using a lift-off process, for example.

The second contact metal layer 322 has a first portion 322' and a second portion 322". An insulated heat-transfer layer 324 is then formed on the first portion 322' of the second contact metal layer 322 by using the deposition-lithograpy-etch process, for example.

Refer to FIG. 5B and FIG. 6 simultaneously, step 502 is performed to form a first dielectric layer 330 to cover the insulated heat-transfer layer 324, the exposed portion of the second contact metal layer 322, the exposed portion of the first contact metal layer 320, the exposed portion of the first conductivity type semiconductor layer 314, the exposed portion of the second conductivity type semiconductor layer 318, and the exposed portion of the active layer 316 of the light-emitting diode structure 310, so as to isolate the first contact metal layer 320 and the second contact metal layer 322. The step of forming the first dielectric layer 330 further includes forming at least one first hole 330a, at least one second hole 330b, and at least one third hole 330c by using, for example, a lithography-and-etch process. The first hole 330a, the second hole 330b, and the third hole 330c respectively expose a portion of the first contact metal layer 320, a portion of the second contact metal layer 322, and a portion of the insulated heat-transfer layer 324. The first hole 330a, the second hole 330b, and the third hole 330c are formed to respectively include a via hole 332a and a trench 332b, a via hole 334a and a trench 334b, and a via hole 336a and a trench 336b.

Refer to FIG. 5B again, step 504 is performed to form a first-level metal interconnect including three blocks 340, 350, and 360 to respectively fill the first hole 330a, the second hole 330b, and the third hole 330c. In some examples, the block 340 includes a via 340a and a landing pad 340b connected to each other, the block 350 includes a via 350a and a landing pad 350b connected to each other, and the block 360 includes a via 360a and a landing pad 360b connected to each other. The vias 340a, 350a, and 360a respectively fill the via holes 332a, 334a, and 336a, and the landing pads 340b, 350b and 360b respectively fill the trenches 332b, 334b, and 336b and are separated from each other. Thus, the first-level metal interconnect including three blocks 340, 350, and 360 which are respectively connected to the first contact metal layer 320, the second contact metal layer 322, and the insulated heat-transfer layer 324. For example, the blocks 340, 350, and 360 may be formed by using the damascene process or lift-off process.

Refer to FIG. 5C and FIG. 6, step 506 is performed to form a second dielectric layer 370 to cover the first dielectric layer 330, the three landing pads 340b, 350b, and 360b of the first-level metal interconnect. The step of forming the second dielectric layer 370 further includes forming at least one fourth hole 370a, at least one fifth hole 370b, and at least one sixth hole 370c passing through the second dielectric layer 370 by using, for example, a lithography-and-etch process. The fourth hole 370a, the fifth hole 370b, and the sixth hole 370c respectively expose a portion of the landing pad 340b, a portion of the landing pad 350b, and a portion of the landing pad 360b of the heat-transfer connector 360. In some exemplary examples, the fourth hole 370a, the fifth hole 370b, and the sixth hole 370c are preferably dislocated to the vias 340a, 350a, and 360a in the first dielectric layer 330.

Refer to FIG. 5C again, step 508 is performed to build the second-level metal interconnect, that includes a first bonding pad structure 380, a second bonding pad structure 390, and a heat-dissipating pad structure 400 for heat-dissipation, which are separated from each other. In some examples, the first bonding pad structure 380, the second bonding pad structure 390, and the heat-dissipating pad structure 400 are formed to respectively include a via 382 and a bonding pad 384 connected to each other, a via 392 and a bonding pad 394 connected to each other, and a via 402 and a heat-dissipating pad 404 connected to each other, in which the vias 382, 392, and 402 respectively fill the fourth hole 370a, the fifth hole 370b, and the sixth hole 370c, and the bonding pads 384 and 394 and the heat-dissipating pad 404 are all located on the surface 372 of the second dielectric layer 370. Thus, the first bonding pad structure 380, the second bonding pad structure 390, and the heat-dissipating pad structure 400 are respectively connected to the landing pad 340b, the landing pad 350b, and the heat-transfer pad 360b for heat dissipation. For example, the first bonding pad structure 380, the second bonding pad structure 390, and the heat-dissipating pad structure 400 may be formed by using a lift-off process.

Refer to FIG. 3 again, step 510 is performed to provide a circuit board 410, in which the circuit board 410 includes a carrier 412, a first electrode 414, a second electrode 416, and a heat-dissipating electrode 418. The carrier 412 has a first surface 412a and a second surface 412b, which are opposite to each other. The first electrode 414, the second electrode 416, and the heat-dissipating electrode 418 are disposed on the first surface 412a of the carrier 412, and are separated from each other. The first electrode 414, the second electrode 416, and the heat-dissipating electrode 418 may be metal electrodes. In some exemplary examples, the carrier 412 has a through hole 412' extending from the first surface 412a to the second surface 412b. In addition, the heat-dissipating electrode 418 is formed on the first surface 412a and extends to the second surface 412b through the through hole 412'. For example, the heat-dissipating electrode 418 extends on a majority of the second surface 412b for a wide spread of heat flow to increase the contact area with the heat sink in lighting system, and the spreading extent mainly depends on the thickness of the heat-dissipating electrode. The carrier 412 is less related to the horizontal spread of heat flow, hence the material option of carrier 412 could be diverse. It implies that the thermal-electrical separation nature of the presented light-emitting diode structure 310 enables not only a superior heat dissipation potential but also a cost-down alternative for the thermal management of a lighting system. Furthermore, an array form of the light-emitting diode structure 310 could be disposed on the circuit board 410 with a close distance because of their superior heat-dissipating characteristic and thermal-electrical separation nature, which implies a more compact dimension of lighting system could be achieved.

Refer to FIG. 3 and FIG. 6 again, the purpose of step 512 is to flip over the light-emitting diode structure 310 and to dispose it on the circuit board 410. The first bonding pad structure 380, the second bonding pad structure 390, and the heat-dissipating pad structure 400 are disposed on the first electrode 414, the second electrode 416, and the heat-dissipating electrode 418. After the steps mentioned above, the flip chip type light-emitting diode 300 is substantially completed. For example, the light-emitting diode structure 310 may be combined with the circuit board 410 by using a solder paste process or an eutectic process. In some examples, the light-emitting diode structure 310 may be connected to the carrier 420 shown in FIG. 4 to form the flip chip type light-emitting diode 300a as shown in FIG. 4.

According to the aforementioned embodiments, another advantage of the present invention is that a flip chip type light-emitting diode of the present invention combines the merits of an insulated heat-transfer layer and a two-level metal interconnect structure to build an efficient thermal conduction path while the electrical conduction is blocked. The heat power generated in the active layer flows through the second conductivity type semiconductor layer and then can be transferred by the insulated heat-transfer layer without electrical current flow. The heat power continues to flow, via the two-level metal interconnect structure, from the insulated heat-transfer layer to the heat-dissipating pad on the light-emitting diode diode's surface.

According to the aforementioned embodiments, still another advantage of the present invention is that the thermal-electrical isolation nature inside the light-emitting diode structure 310 omits the electrical isolation requirement for the heat-dissipating pad on carrier board. Hence, the circuit board 410 in FIG. 3 can use a through hole structure to conduct the heat flow to the backside by the heat-dissipating electrode 418, and the circuit board 420 in FIG. 4 removes a portion of the insulation layer 424, allowing the heat-dissipation pad structure 400 to be connected to the carrier 422 through the thermal pad electrode 430. Furthermore, both the high efficient vertical conduction and the superior horizontal spreading capability for the heat flow in the present invention makes a high-density chip-on-board (COB) application feasible.

Although the present invention has been described in considerable detail with reference to certain embodiments thereof, the foregoing embodiments of the present invention are illustrative of the present invention rather than limiting of the present invention. It will be apparent to those having ordinary skill in the art that various modifications and variations can be made to the present invention without departing from the scope or spirit of the invention. Therefore, the spirit and scope of the appended claims should not be limited to the description of the embodiments contained herein.

What is claimed is:

1. A flip chip type light-emitting diode comprising:
   a light-emitting diode structure comprising:
      a substrate;
      a first conductivity type semiconductor layer disposed on the substrate;
      an active layer disposed on a first portion of the first conductivity type semiconductor layer;
      a second conductivity type semiconductor layer disposed on the active layer;
      a first contact metal layer disposed on a second portion of the first conductivity type semiconductor layer;
      a second contact metal layer disposed on the second conductivity type semiconductor layer; and
      an insulated heat-transfer layer disposed on a first portion of the second contact metal layer;
   a first dielectric layer covering the light-emitting diode structure, wherein the first dielectric layer has at least one first hole exposing a portion of the first contact metal layer, at least one second hole exposing a portion of the second contact metal layer, and at least one third hole exposing a portion of the insulated heat-transfer layer;
   at least one first-level metal interconnect at least divided into a first block, a second block and a third block spatially separated, which fill the at least one first hole, the at least one second hole, and the at least one third hole;
   a second dielectric layer covering the first dielectric layer, the first-level metal interconnect, wherein the second dielectric layer has at least one fourth hole exposing a portion of the first block of the first-level metal interconnect, at least one fifth hole exposing a portion of the second block of the first-level metal interconnect, and at least one sixth hole exposing a portion of the third block of the first-level metal interconnect;
   at least one first bonding pad structure, at least one second bonding pad structure, and at least one heat-dissipating pad structure separated from each other and respectively extending from the at least one fourth hole, the at least one fifth hole, and the at least one sixth hole to a surface of the second dielectric layer; and
   a circuit board comprising a carrier, and a first electrode, a second electrode, and a heat-dissipating electrode which are separated from each other and are disposed on a first surface of the carrier, wherein the at least one first bonding pad structure, the at least one second bonding pad structure, and the at least one heat-dissipating pad structure are respectively disposed on the first electrode, the second electrode, and the heat-dissipating electrode.

2. The flip chip type light-emitting diode of claim 1, wherein a material of the insulated heat-transfer layer is AlN, $Al_2O_3$, BeO, or MgO.

3. The flip chip type light-emitting diode of claim 1, wherein the carrier is a ceramic board, a printed circuit board, or an integrated circuit package carrier.

4. The flip chip type light-emitting diode of claim 1, wherein the carrier further comprises a second surface opposite to the first surface, the carrier has at least one through hole extending from the first surface to the second surface, and the at least one heat-dissipating pad structure extends from the first surface to the second surface through the through hole.

5. The flip chip type light-emitting diode of claim 1, wherein the circuit board is a metal core printed circuit board, and the circuit board further comprises an insulation layer disposed on the first surface of the carrier, and wherein the insulation layer has at least one contact hole exposing a portion of the first surface of the carrier, the first electrode and the second electrode are located on a surface of the insulation layer, and the heat-dissipating electrode extends from the surface of the insulation layer through the contact hole and is connected to the portion of the first surface of the carrier.

6. A method for manufacturing a flip chip type light-emitting diode, the method comprising:
   forming a light-emitting diode structure, wherein forming the light-emitting diode structure comprises:
      forming a first conductivity type semiconductor layer on a substrate;
      forming an active layer on a first portion of the first conductivity type semiconductor layer;
      forming a second conductivity type semiconductor layer on the active layer;
      forming a first contact metal layer on a second portion of the first conductivity type semiconductor layer;
      forming a second contact metal layer on the second conductivity type semiconductor layer; and
      forming an insulated heat-transfer layer on a first portion of the second contact metal layer;

forming a first dielectric layer to cover the light-emitting diode structure, wherein forming the first dielectric layer comprises forming at least one first hole exposing a portion of the first contact metal layer, at least one second hole exposing a portion of the second contact metal layer, and at least one third hole exposing a portion of the insulated heat-transfer layer;

forming a first-level metal interconnect at least comprising a first block, a second block and a third block respectively filling the at least one first hole, the at least one second hole, and the at least one third hole;

forming a second dielectric layer to cover the first dielectric layer and the first-level metal interconnect, wherein forming the second dielectric layer comprises forming at least one fourth hole exposing a portion of the first block of the first-level metal interconnect, at least one fifth hole exposing a portion of the second block of the first-level metal interconnect, and at least one sixth hole exposing a portion of the third block of the first-level metal interconnect;

forming at least one first bonding pad structure, at least one second bonding pad structure, and at least one heat-dissipating pad structure separated from each other and respectively extending from the at least one fourth hole, the at least one fifth hole, and the at least one sixth hole to a surface of the second dielectric layer; and providing a circuit board, wherein the circuit board comprises a carrier, and a first electrode, a second electrode, and a heat-dissipating electrode which are disposed a first surface of the carrier and are separated from each other; and deposing the at least one first bonding pad structure, the at least one second bonding pad structure, and the at least one heat-dissipating pad structure respectively on the first electrode, the second electrode, and the heat-dissipating electrode.

7. The method for manufacturing a flip chip type light-emitting diode of claim 6, wherein forming the second contact metal layer comprises:

forming an ohmic contact metal layer on the second conductivity type semiconductor layer; and forming a diffusion barrier layer to enclose the ohmic contact metal layer.

8. The method for manufacturing a flip chip type light-emitting diode of claim 7, wherein a material of the diffusion barrier layer is platinum (Pt), titanium tungsten (TiW), titanium nitride or a combination thereof.

9. The method for manufacturing a flip chip type light-emitting diode of claim 6, wherein a material of the insulated heat-transfer layer is AlN, $Al_2O_3$, BeO, or MgO.

10. The method for manufacturing a flip chip type light-emitting diode of claim 6, wherein forming each of the at least one first hole, the at least one second hole, and the at least one third hole comprises forming a first via hole and a first trench communicating with each other; and forming each of the at least one fourth hole, the at least one fifth hole, and the at least one sixth hole comprises forming a second via hole, wherein locations of the first via holes and locations of the second via holes are dislocated along the vertical direction.

11. The method for manufacturing a flip chip type light-emitting diode of claim 6, wherein the carrier is a ceramic board, a printed circuit board, or an integrated circuit package carrier.

12. The method for manufacturing a flip chip type light-emitting diode of claim 6, wherein the carrier further comprises a second surface opposite to the first surface, the carrier has at least one through hole extending from the first surface to the second surface, and the at least one heat-dissipating pad structure extends from the first surface to the second surface through the through hole.

13. The method for manufacturing a flip chip type light-emitting diode of claim 6, wherein the circuit board is a metal core printed circuit board, and the circuit board further comprises an insulation layer disposed on the first surface of the carrier, and wherein the insulation layer has at least one contact hole exposing a portion of the first surface of the carrier, the first electrode and the second electrode are located on a surface of the insulation layer, and the heat-dissipating electrode extends from the surface of the insulation layer through the at least one contact hole and is connected to the portion of the first surface of the carrier.

* * * * *